United States Patent [19]
Yamamoto et al.

[11] Patent Number: 5,434,540
[45] Date of Patent: Jul. 18, 1995

[54] HIGH EFFICIENCY POWER AMPLIFIER

[75] Inventors: Kaizo Yamamoto; Tadahiko Sugiura, both of Tokyo, Japan

[73] Assignee: NEC Corporation, Tokyo, Japan

[21] Appl. No.: 309,578

[22] Filed: Sep. 21, 1994

[30] Foreign Application Priority Data

Sep. 22, 1993 [JP] Japan .................. 5-259153

[51] Int. Cl.$^6$ ............................................. H03F 3/217
[52] U.S. Cl. ................................ 330/251; 330/207 A; 330/306
[58] Field of Search ............... 330/51, 207 A, 251, 330/286, 306

[56] References Cited
U.S. PATENT DOCUMENTS 4,717,884  1/1988  Mitzlaff ................. 330/251

FOREIGN PATENT DOCUMENTS 63-204912  8/1988  Japan .
64-74813   3/1989  Japan .

OTHER PUBLICATIONS

1 EEE Transaction on Electron Devices vol. ED-14, No. 12, Dec. 1967 pp. 851-857.

*Primary Examiner*—James B. Mullins

[57] ABSTRACT

In a high efficiency F-class amplifier, output current may be reduced to cause distortion of the current, or deterioration of high efficiency operation of the amplifier, when an instantaneous output voltage of an amplifying transistor becomes lower than a saturation voltage. To prevent this, the peak value of the high freqency instantaneous output voltage is restricted by a peak value restricting circuit provided in parallel to a load. Thus, an ideal high efficiency amplifier can be provided by avoiding distortion of the output current.

16 Claims, 5 Drawing Sheets $-(V_D - V_S)$ $V_O = V_Z - (V_D - V_S)$ $-V_O = -\{V_Z - (V_D - V_S)\}$ $-V_O = -\{V_Z - (V_D - V_S)\}$ $+V_O = +\{V_Z - (V_D - V_S)\}$ PHASE OF
FUNDAMENTAL WAVE θ(rad)

PHASE OF
FUNDAMENTAL WAVE θ(rad)

DRAIN VOLTAGE $V_D$

HIGH EFFICIENCY POWER AMPLIFIER

BACKGROUND OF THE INVENTION

1. Field of the Invention

The present invention relates generally to a high efficiency power amplifier. More specifically, the invention relates to a high efficiency power amplifier to be employed in a high frequency band for performing F-class operation.

2. Description of the Related Art

In this type of F-class high efficiency power amplifier, it is required to provide an impedance matching circuit so that load impedance of a transistor, such as a field-effect transistor (FET) as an active element for amplification, matches with a fundamental wave, becomes zero (short) with respect to a second high harmonic wave and becomes infinite (open) with respect to a third high harmonic wave.

Here, it should be noted that "F-class operation" means that, in a high frequency amplifier and so forth, a pulse form wave is generated at the output side utilizing high harmonic components (harmonic tuning) and high efficiency operation is thus performed. In this case, a bias for an amplifier active element is set to be the B-class bias.

As examples of the F-class power amplifiers of this type, there are amplifiers disclosed in "IEEE Transactions on Electron Devices" vol. 14, No. 12, pp 851 to 857, Japanese Unexamined Patent Publication (Kokai) No. Showa 63-204912, and Japanese Unexamined Patent Publication No. Showa 64-74813.

FIG. 12 shows an example of such F-class power amplifier. As shown in FIG. 12, the amplifier comprises a FET 1 as the amplifier active element, a coupling capacitor 2 for blocking a direct current, an RF current-blocking inductor 3 charging a direct current bias $V_D$ to the drain of FET 1, loads 4 to 6 for the FET 1 and a bias circuit 10 for providing the B-class bias for the FET 1.

The load includes resonance circuit 4 for providing a predetermined impedance (matching impedance) $Z_1$ for a fundamental wave, a resonance circuit 5 for providing zero impedance for even harmonics and a resonance circuit 6 providing infinite impedance for odd harmonics.

FET 1 is charged a direct current voltage $V_D$ via the inductor 3 at the drain electrode D thereof and a bias voltage $V_{GS}$ at the gate electrode G from the bias circuit 10 so that a drain current $i_D$ may flow for a half period of an input sine wave, as shown in FIG. 13A.

It is assumed that the peak value of the drain current $i_D$ is $I_p$, the fourth or higher degree of high harmonic components of the drain current $i_D$ can be ignored, and the internal resistance of the FET 1 is sufficiently small.

Under the condition set forth above, the load impedance to maximize a drain efficiency $\eta_D$ can be expressed as:

$Z1 = 4V_D/(3^{\frac{1}{2}} IP)$ (fundamental frequency wave impedance)

$Z2 = 0$ (second high harmonic wave impedance)

$Z3 = \infty$ (third high harmonic wave impedance).

The drain efficiency then becomes $\eta_D = \pi/(2 \cdot 3^{\frac{1}{2}})$.

The amplitude of fundamental wave voltage $V_1$ of an amplifier output is:

$V_1 = 2V_D/3^{\frac{1}{2}}$ and thus becomes greater than the direct current bias voltage $V_D$. However, since the FET 1 is maintained in conductive state during a period where the output fundamental wave voltage $v_D$ is negative, the instantaneous value of the drain voltage $v_D$ becomes the waveform as illustrated by dotted line in FIG. 13B. In the range (shown as a period T) where the phase $\theta$ of the fundamental wave is $\pi/3 \leq \theta \leq 2\pi/3$, $v_D$ is maintained substantially zero.

Namely, the absolute value of the sum of the all high frequency instantaneous voltages generated at the load is restricted to the direct current bias voltage $V_D$.

In the conventional F-class amplifier, it can be considered that the drain current is obtained in a waveform of FIG. 13A irrespective of the drain voltage. However, in the microwave band FET as put into practical use, the drain voltage versus drain current characteristics, taking the gate voltage $V_{GS}$ as parameter, becomes as illustrated in FIG. 14, in which the drain current depends on the drain voltage in a range where the drain voltage is lower than or equal to a knee voltage, i.e. saturation voltage $V_S$.

Accordingly, in the range where the drain voltage $v_D$ is less than saturation voltage and close to zero volt, the drain current waveform does not become half sine waveform as illustrated in FIG. 13A, but becomes a double hump waveform (a waveform having two peaks (humps) such as the peak portion of the waveform illustrated in FIG. 13B) of waveform at the peak portion to cause distortion of the drain current waveform.

Due to distortion of the drain current, the fundamental wave component in the drain current is reduced and other high harmonic components may also be varied so that an ideal harmonic tuning amplifier can not be realized and thus the degradation of efficiency results.

SUMMARY OF THE INVENTION

It is an object of the present invention to provide a high efficiency power amplifier which permits substantially ideal harmonic tuning amplification by preventing distortion of the drain current by avoiding the instantaneous drain voltage becoming substantially zero.

In the conventional circuit illustrated in FIG. 12, the minimum value of the instantaneous drain voltage of FET 1 becomes substantially zero, since the ON resistance of FET 1 is substantially zero, to cause reduction of the drain current or distortion of drain current waveform as described previously and also can be seen from the characteristics illustrated in FIG. 14. The present invention prevents reduction of the drain current and whereby avoid distortion of the waveform by preventing the value of the minimum drain voltage becoming less than or equal to a saturation voltage $V_S$.

According to the present invention, a power amplifier comprises:

an amplifying active element;

bias means for supplying a B-class operation bias for the amplifying active element;

load having a predetermined impedance for a fundamental wave of an amplified output of the amplifying active element, a zero impedance for even high harmonics and infinite impedance for odd high harmonics; and restricting means connected in parallel to the load for restricting the amplified output instantaneous voltage to be higher than or equal to a saturation voltage of the amplifying active element.

BRIEF DESCRIPTION OF THE DRAWING

The present invention will be understood more fully from the detailed description given herebelow and from the accompanying drawings of the preferred embodiment of the present invention, which, however, should not be taken to be limitative to the invention, but are for explanation and understanding only.

In the drawings.

DESCRIPTION OF THE PREFERRED EMBODIMENT

The present invention will be discussed hereinafter in detail with reference to FIGS. 1 to 11. In the following description, numerous specific details are set forth in order to provide a through understanding of the present invention. It will be obvious, however, to those skilled in the art that the present invention may be practiced without these specific details.

Figure 1:
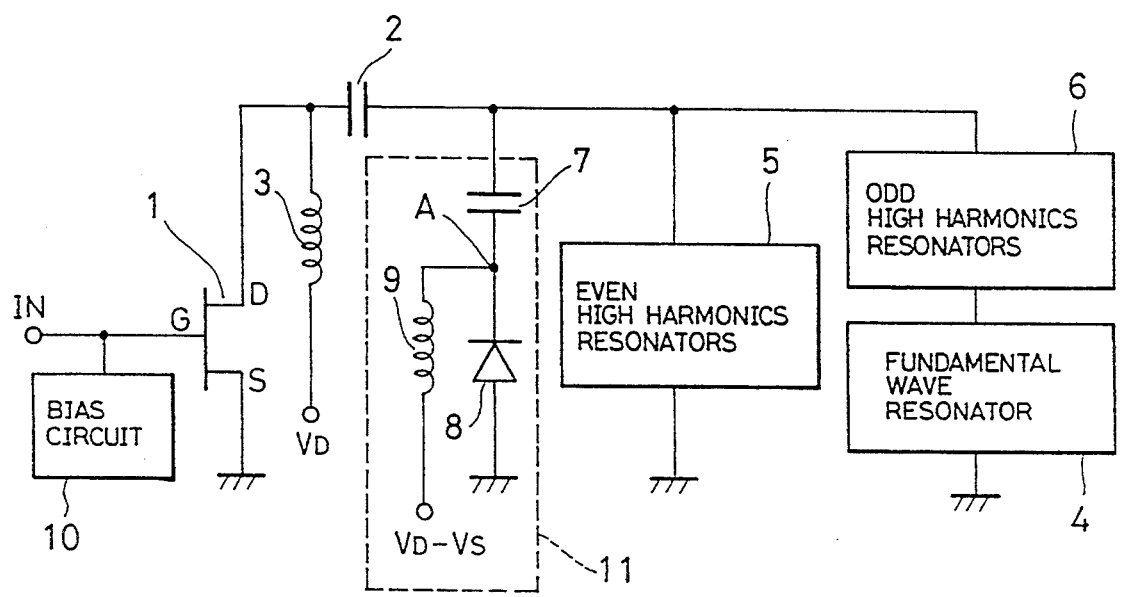
FIG. 1 is a circuit diagram showing one embodiment of a high efficiency power amplifier according to the invention.
Figure 12:
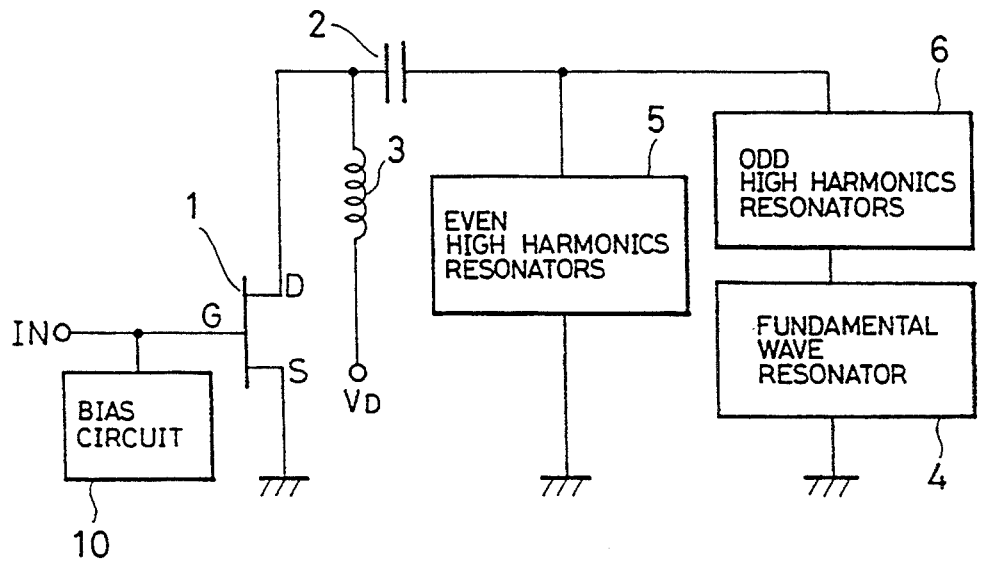
FIG. 12 is a circuit diagram showing an example of the conventional high efficiency power amplifier.

FIG. 1 is a circuit diagram of the first embodiment of a high efficiency power amplifier according to the present invention. In FIG. 1, the like components to FIG. 12 are represented by like reference numerals. Therefore, the following discussion will be given mainly for the portions different from the prior art shown in FIG. 12.

In the shown embodiment, a peak value restricting circuit 11 is provided in parallel to load circuits 4 to 6 of FET 1. The peak value restricting circuit 11 includes a series circuit of a capacitor 7 and a diode 8. On the cathode of the diode 8 (a common junction A with the capacitor 7) a direct current bias $(V_D-V_S)$ is applied via a high freqency blocking inductor 9.

In the construction set forth above, when the maximum absolute value of the sum of all high frequency instantaneous voltages generated at the load becomes greater than $(V_D-V_S)$, the diode 8 becomes conductive at the negative side of the instantaneous value of the summed high frequency voltage. Therefore, substantially for the period T of FIG. 13B, the series circuit of the diode 8 and the capacitor 7 has a low impedance of substantially zero. As a result, the maximum absolute value of the negative side of the summed high frequency instantaneous voltage is restricted to $(V_D-V_S)$ as shown by the solid line in FIG. 13.

It should be noted that, in the prior art, the maximum absolute value is $V_D$ which causes lowering of the drain current to result in distortion of the current waveform.

In the positive half cycle of the summed high frequency instantaneous voltage, FET 1 and the diode 8 are held OFF. However, by the operations of the resonance circuits 4 to 6, a waveform symmetric to the one in the negative half cycle with respect to the zero-crossing point can be obtained in the positive half cycle. Therefore, the maximum value is also restricted to $(V_D-V_S)$.

Figure 13A:
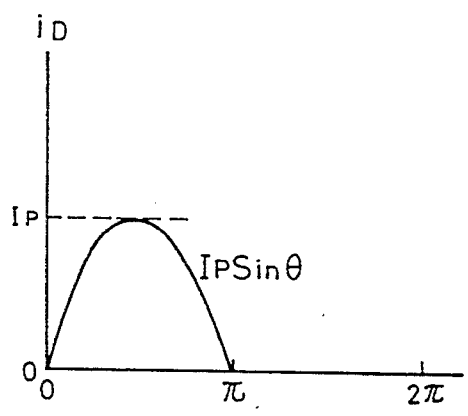
FIG. 13A is a waveform of drain current of a FET of the high efficiency power amplifier.

In the circuit of FIG. 1, the amplifier element is FET 1. Here, it is assumed that the gate electrode of the FET 1 is applied the bias voltage $V_{GS}$ by the bias circuit 10 so that the drain current may flow only in half cycle of the sine wave of the high frequency signal, as shown in FIG. 13A. Also, the peak value of the drain current is assumed as Furthermore, it is assumed that the fourth order or higher harmonic components can be ignored and that the internal resistance in the transistor is sufficiently small.

Figure 13B:
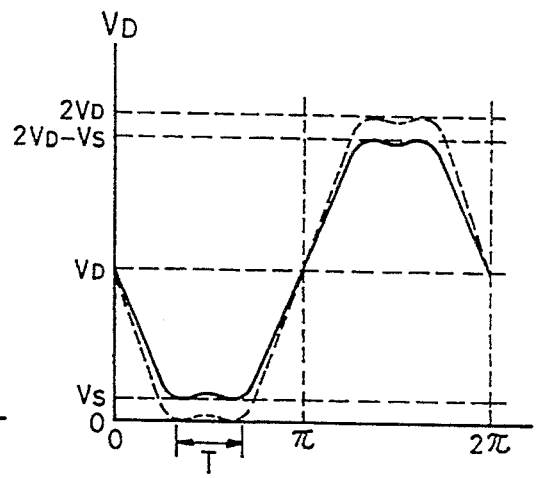
FIG. 13B is a chart showing drain voltage waveforms of the conventional amplifier and the amplifier of the present invention, for comparison.
Figure 14:
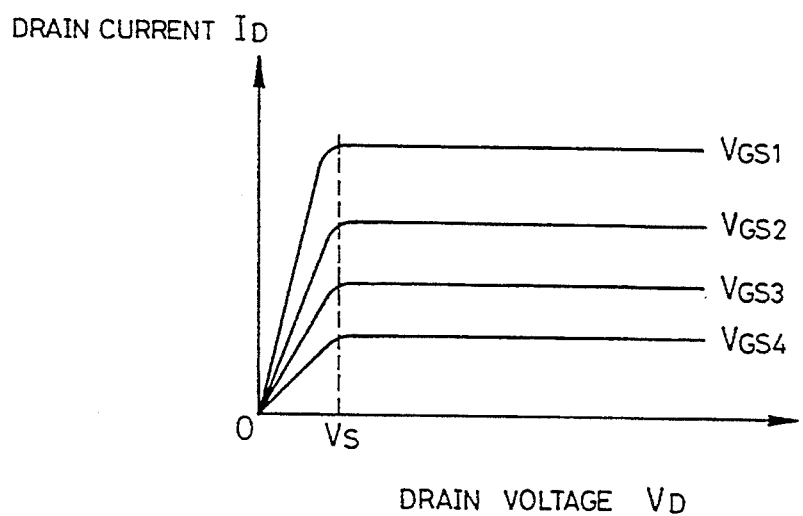
FIG. 14 is a chart showing characteristics of drain voltage vs drain current.

By setting the load impedance in this case as:

$$Z1 = 4(V_D - V_S)/(3^{\frac{1}{2}} I_P)$$

$$Z2 = 0$$

$$Z3 = \infty$$

the waveform of the instantaneous drain voltage $v_D$ becomes as illustrated by the solid line in FIG. 13B. Namely, since the instantaneous value of the drain voltage can not be smaller than $V_S$, the drain current waveform can be maintained as half sine wave shown in FIG. 13A without distortion. Therefore, an F-class amplifier with harmonic tuning which operates substantially as designed, can be realized.

In this case, the drain efficiency becomes:

$$\eta_D = (1 - V_S/V_D) \pi/(2 \cdot 3^{\frac{1}{2}})$$

Figure 2:
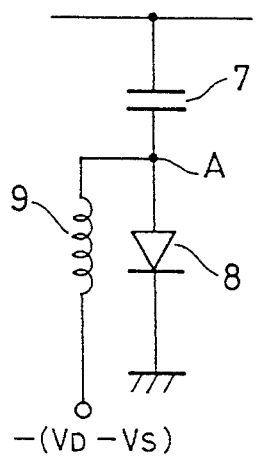
FIG. 2 is a partial circuit diagram showing another embodiment of a high efficiency power amplifier according to the invention.

FIG. 2 shows another embodiment of the peak value restricting circuit 11, in which the polarity of the diode 8 is reversed to that in the embodiment of FIG. 1.

Namely, the anode is connected to the junction A and the cathode is connected to a grounding line. The junction point A is supplied the bias of $-(V_D-V_S)$ via a choke coil 9.

In the shown embodiment, the diode turns on at the positive side of the instantaneous value of the summed high frequency voltage. Therefore, similarly to the former embodiment, the drain voltage waveform with a restricted peak value as illustrated by the solid line in FIG. 13B can be obtained.

Figure 3:
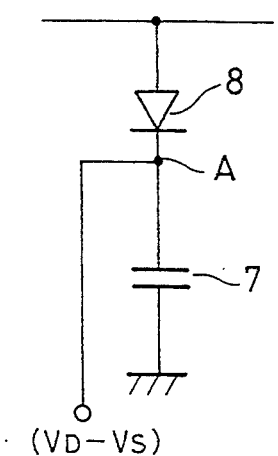
FIG. 3 is a partial circuit diagram showing a further embodiment of a high efficiency power amplifier according to the invention.

FIG. 3 shows a further embodiment of the peak restricting circuit 11. In the shown embodiment, the diode 8 is disposed between the signal line and a junction point A with the anode connected to the signal line and the cathode connected to the junction point A. The capacitor 7 is disposed between the junction point A and the grounding line.

With the shown construction, the bias $(V_D-V_S)$ is directly applied to the cathode of the diode via the junction A. In the shown construction, the alternating current blocking coke coil 9 presented in the embodiments of FIGS. 1 and 2 is eliminated. This is because the cathode is grounded by the effect of the capacitor 7 for the alternating currents.

In this circuit, when the maximum absolute value of the sum of all high frequency voltages generated at the load becomes greater than $(V_D-V_S)$, the diode 8 turns on to make the impedance of the series circuit of the diode 8 and the capacitor 7 at low impedance of substantially zero. Therefore, the maximum value can be restricted to $(V_D-V_S)$.

Figure 4:
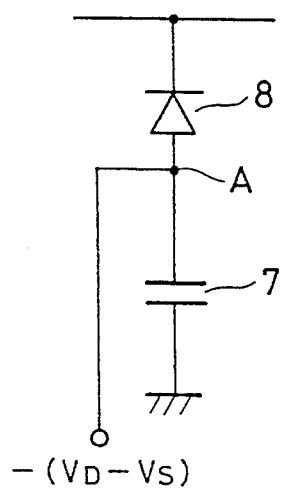
FIG. 4 is a partial circuit diagram showing a still further embodiment of a high efficiency power amplifier according to the invention.

FIG. 4 shows a still further embodiment of the peak restricting circuit 11. In the shown embodiment, the polarity of the diode 8 is reversed from that in the embodiment of FIG. 3. Namely, the anode of the diode 8 is connected to the junction point A and cathode is connected to the signal line. The bias of $-(V_D-V_S)$ is directly applied to the junction point A. In this case, the diode 8 turns on at negative side of the instantaneous value of the summed high frequency voltage.

Figure 5:
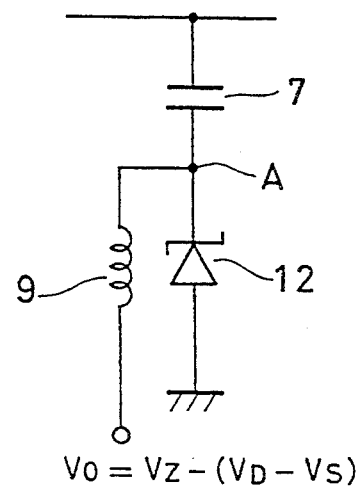
FIG. 5 is a partial circuit diagram showing a yet further embodiment of a high efficiency power amplifier according to the invention.

FIG. 5 shows a yet further embodiment of the peak restricting circuit 11. In the shown embodiment, the capacitor 7 is disposed between the signal line and the junction point A, and a Zener diode 12 is provided between the junction point A and the grounding line. The Zener diode 12 is connected to the junction point A at the cathode and to the grounding line at the anode. To the junction point, a bias voltage of $V_0=V_Z-(V_D-V_S)$, where $V_Z$ is Zener voltage of the Zener diode.

Figure 6:
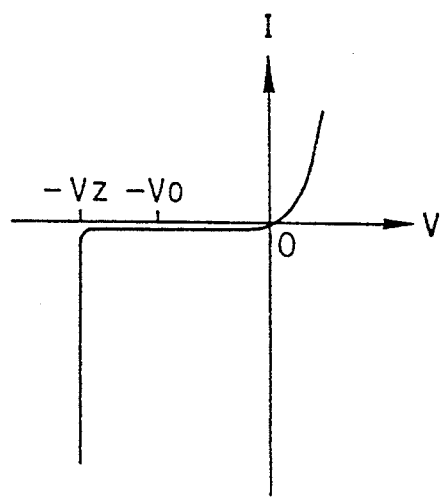
FIG. 6 is a chart showing an example of characteristics of Zener diode.

FIG. 6 shows a voltage-current characteristics of the Zener diode 12. The relationship between the bias voltage $V_0$ applied to the junction point A and the Zener voltage is set as illustrated in FIG. 6. It should be appreciated that selecting relationship of $V_Z$, $V_D$ and $V_S$ to satisfy the condition expressed $$V_Z \geq 2(V_D-V_S)$$

is necessary to obtain a desired dynamic range of the amplified output signal.

Even in the shown embodiment, similarly to the foregoing embodiments of FIGS. 1 to 4, the peak value of the output can be restricted to $(V_D-V_S)$.

Figure 7:
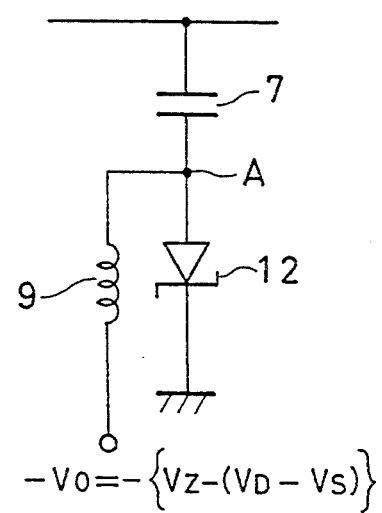
FIG. 7 is a partial circuit diagram showing a further embodiment of a high efficiency power amplifier according to the invention.

FIG. 7 shows a further embodiment of the peak restricting circuit 11. In the shown embodiment, the polarity of the Zener diode 12 is reversed from the embodiment illustrated in FIG. 5. In this case, the bias voltage to be applied to the series junction point A is set at $-V_0=-\{V_Z-(V_D-V_S)\}$.

Figure 8:
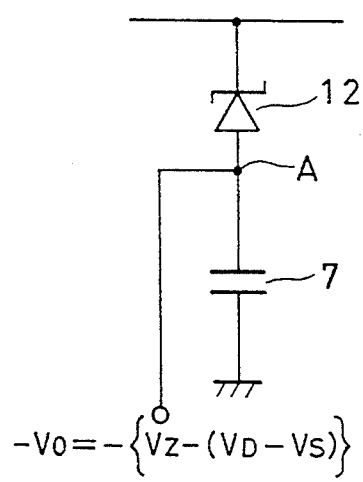
FIG. 8 is a partial circuit diagram showing a still further embodiment of a high efficiency power amplifier according to the invention.

FIG. 8 shows a still further embodiment of the peak value restricting circuit 11. In the shown embodiment, the Zener diode 12 is disposed between the signal line and the junction point A, and the capacitor 7 is disposed between the junction point A and the grounding line. The cathode of the Zener diode 12 is connected to the signal line and the anode is connected to the junction point A. The direct current bias $-V_0$ is directly applied to the junction point A.

Figure 9:
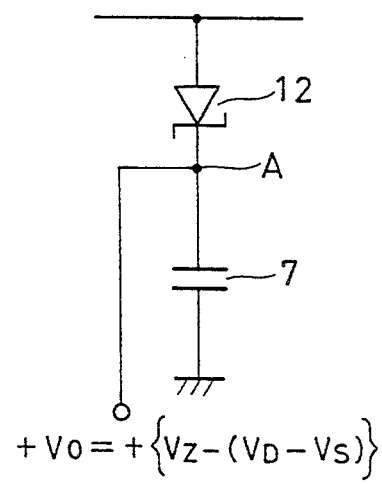
FIG. 9 is a partial circuit diagram showing a yet further embodiment of a high efficiency power amplifier according to the invention.

FIG. 9 shows a yet further embodiment of the peak restricting circuit 11. In the shown embodiment, the polarity of the Zener diode 12 disposed between the signal line and the junction point A is reversed from that of FIG. 8. In this case, the direct current bias voltage to be applied to the junction point becomes $V_0$.

Figure 10:
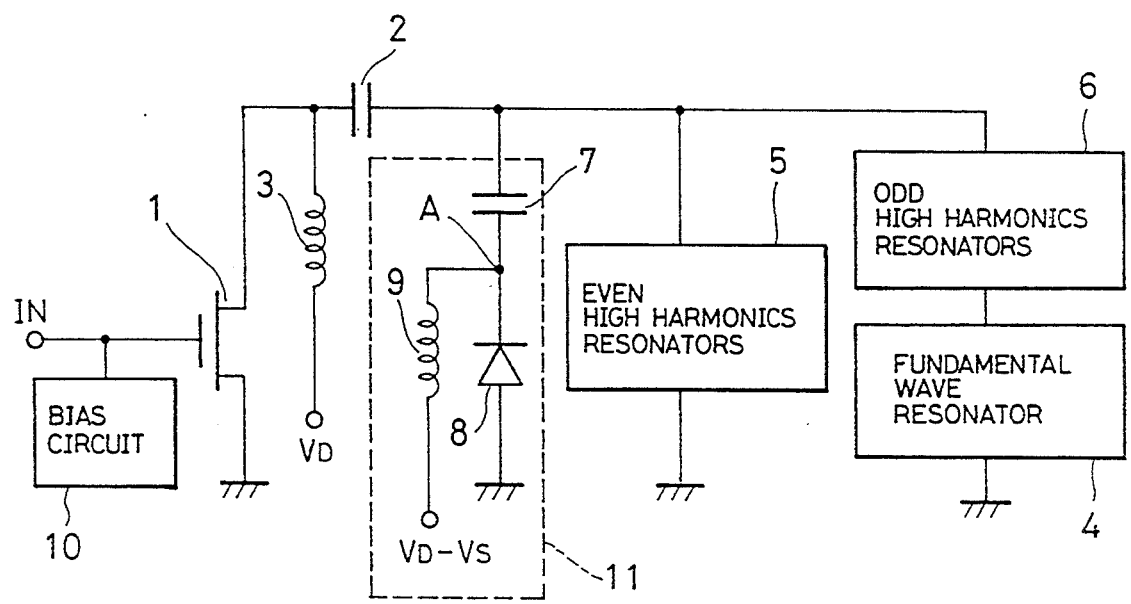
FIG. 10 is a circuit diagram showing a further embodiment of a high efficiency power amplifier according to the invention.

FIG. 10 shows another embodiment of the high efficiency amplifier circuit according to the present invention. In FIG. 10, like reference numerals to FIG. 1 represent like elements. In the shown embodiment, MOSFET 1 is employed as amplifying active element, in place of FET in the former embodiments. Respective embodiments of peak restricting circuits 11 of FIGS. 2, 3, 4, 5, 7, 8 and 9 are applicable.

Figure 11:
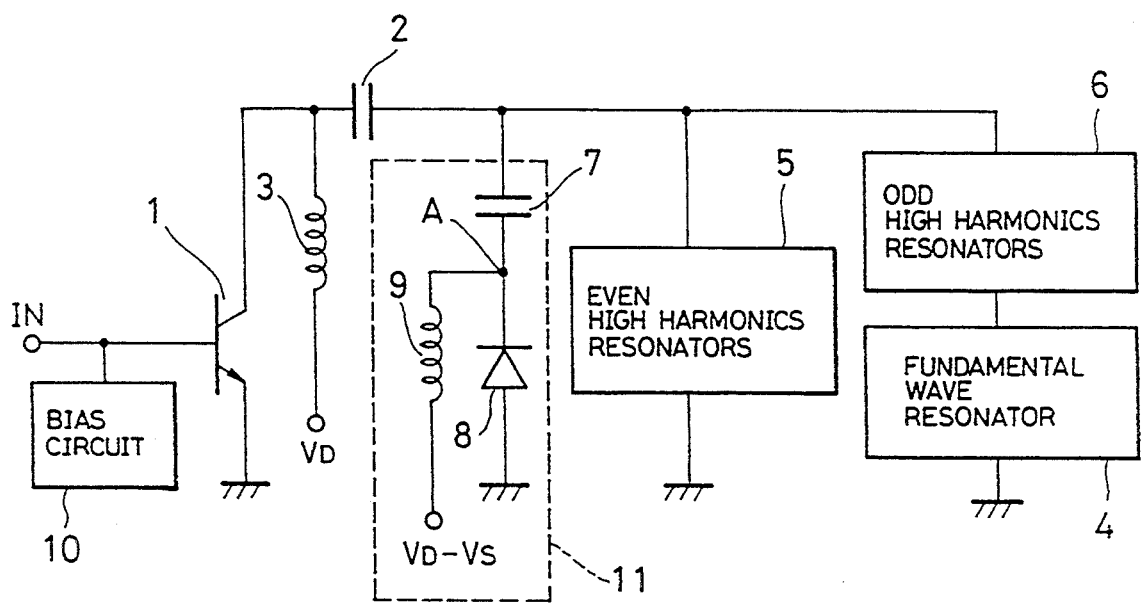
FIG. 11 is a circuit diagram showing a still further embodiment of a high efficiency power amplifier according to the invention.

FIG. 11 shows a further embodiment of the high efficiency amplifier circuit according to the present invention. In FIG. 11, like reference numerals to FIGS. 1 and 11 represent like elements. In the shown embodiment, a bipolar transistor 1 is employed as the amplifying active element in place of the FET and MOSFET in the former embodiments. Even in this case, the peak restricting circuit 11 of FIGS. 2, 3, 4, 5, 7, 8 and 9 are applicable.

As set forth above, according to the present invention, since the circuit for controlling peak of the amplified output is provided in parallel to the load, the drain voltage or collector voltage of the amplifying transistor will never become zero. Therefore, the drain current or collector current will never be lowered. Therefore, distortion of the wave form can be successfully prevented to permit ideal harmonic tuning amplification as designed.

Although the invention has been illustrated and described with respect to exemplary embodiments thereof, it should be understood by those skilled in the art that the foregoing and various other changes, omissions and additions may be made therein and thereto, without departing from the spirit and scope of the present invention. Therefore, the present invention should not be understood as limited to the specific embodiments set out above but to include all possible embodiments which can be embodied within a scope encompassed and equivalents thereof with respect to the feature set out in the appended claims.

What is claimed is:

1. A power amplifier comprising:
   an amplifying active element;
   bias means for supplying a B-class operation bias for said amplifying active element;
   load having a predetermined impedance for a fundamental frequency wave of an amplified output of said amplifying active element, a zero impedance for even high harmonic waves and infinite impedance for odd number degree high harmonic waves; and
   restricting means connected in parallel to said load for restricting said amplified output instantaneous voltage to be higher than or equal to a saturation voltage of said amplifying active element.

2. A power amplifier as set forth in claim 1, wherein said restricting means comprises a variable impedance circuit which becomes low impedance when said amplified output voltage is lower than or equal to the saturation voltage of said amplifying active element.

3. A power amplifier as set forth in claim 2, wherein said variable impedance circuit comprises a series connection circuit of a capacitor and a diode disposed between an output line of said amplifying active element and a grounding line and a bias supply means for supplying a direct current bias to a junction point between said capacitor and said diode.

4. A power amplifier as set forth in claim 3, wherein said capacitor is disposed between said output line and said junction point, said diode is connected to said junction point at a cathode thereof and to said grounding line at an anode thereof, and said bias supplying means comprises a choke coil supplying the direct current bias to said junction point.

5. A power amplifier as set forth in claim 4, wherein said direct current bias is a voltage $(V_D - V_S)$ derived by subtracting said saturation voltage $V_S$ from an output direct current bias $V_D$ of said amplifying active element.

6. A power amplifier as set forth in claim 3, said capacitor is disposed between said output line and said junction point, said diode is connected to said junction point at an anode thereof and to said grounding line at a cathode thereof, and said bias supplying means comprises a choke coil supplying the direct current bias to said junction point.

7. A power amplifier as set forth in claim 6, wherein said direct current bias is a voltage $-(V_D - V_S)$ having an absolute value $(V_D - V_S)$ derived by subtracting said saturation voltage $V_S$ from an output direct current bias $V_D$ of said amplifying active element.

8. A power amplifier as set forth in claim 3, wherein said capacitor is disposed between said grounding line and said junction point, said diode is connected to said output line at an anode thereof and to said junction point at a cathode thereof, and said bias supplying means supplies a voltage $(V_D - V_S)$ derived by subtracting said saturation voltage $V_S$ from an output direct current bias $V_D$ of said amplifying active element.

9. A power amplifier as set forth in claim 3, wherein said capacitor is disposed between said grounding line and said junction point, said diode is connected to said output line at a cathode thereof and to said junction point at an anode thereof, and said bias supplying means supplies a voltage $-(V_D - V_S)$ having an absolute value $(V_D - V_S)$ derived by subtracting said saturation voltage $V_S$ from an output direct current bias $V_D$ of said amplifying active element.

10. A power amplifier as set forth in claim 2, wherein said variable impedance circuit comprises a series connection circuit of a capacitor and a Zener diode disposed between the output line of said amplifying active element and a grounding line and a bias supply means for supplying a direct current bias to a junction point between said capacitor and said Zener diode.

11. A power amplifier as set forth in claim 10, wherein said capacitor is disposed between said output line and said junction point, said Zener diode is connected to said junction point at a cathode thereof and to said grounding line at an anode thereof, and said bias supplying means comprises a choke coil supplying the direct current bias to said unction point.

12. A power amplifier as set forth in claim 11, wherein said direct current bias a voltage expressed by $V_Z - (V_D - V_S)$ with taking a Zener voltage of said Zener diode being $V_Z$, the output direct current bias of said amplifying active element being $V_D$ and said saturation voltage being $V_S$.

13. A power amplifier as set forth in claim 10, said capacitor is disposed between said output line and said junction point, said Zener diode is connected to said junction point at an anode thereof and to said grounding line at a cathode thereof, and said bias supplying means comprises a choke coil supplying the direct current bias to said junction point.

14. A power amplifier as set forth in claim 13, wherein said direct current bias a voltage expressed by $-\{V_Z - (V_D - V_S)\}$ with taking a Zener voltage of said Zener diode being $V_Z$, the output direct current bias of said amplifying active element being $V_D$ and said saturation voltage being $V_S$.

15. A power amplifier as set forth in claim 10, wherein said capacitor is disposed between said grounding line and said junction point, said Zener diode is connected to said output line at an anode thereof and to said junction point at a cathode thereof, and said bias supplying means supplies a voltage expressed by $V_Z - (V_D - V_S)$ with taking a Zener voltage of said Zener diode being $V_Z$, the output direct current bias of said amplifying active element being $V_D$ and said saturation voltage being $V_S$.

16. A power amplifier as set forth in claim 10, wherein said capacitor is disposed between said grounding line and said junction point, said Zener diode is connected to said output line at a cathode thereof and to said junction point at an anode thereof, and said bias supplying means supplies a voltage expressed by $-\{V_Z - (V_D - V_S)\}$ with taking a Zener voltage of said Zener diode being $V_Z$, the output direct current bias of said amplifying active element being $V_D$ and said saturation voltage being $V_S$.

* * * * *